United States Patent [19]

Otsuka et al.

[11] Patent Number: 4,965,653
[45] Date of Patent: Oct. 23, 1990

[54] SEMICONDUCTOR DEVICE AND METHOD OF MOUNTING THE SEMICONDUCTOR DEVICE

[75] Inventors: Kanji Otsuka, Higashiyamato; Shigeo Kuroda, Ohme; Katsuyuki Sato, Kodaira; Hisashi Nakamura, Ohme; Shinichi Shouji, Akishima, all of Japan

[73] Assignees: Hitachi, Ltd.; Hitachi VLSI Engineering Corp., both of Tokyo, Japan

[21] Appl. No.: 489,714

[22] Filed: Feb. 28, 1990

Related U.S. Application Data

[63] Continuation of Ser. No. 210,913, Jun. 24, 1988, abandoned.

[30] Foreign Application Priority Data

Jun. 26, 1987 [JP] Japan .................................. 62-157647
Jun. 26, 1987 [JP] Japan .................................. 62-157649
Sep. 9, 1987 [JP] Japan .................................. 62-223962
Oct. 14, 1987 [JP] Japan .................................. 62-257121

[51] Int. Cl.⁵ ...................... H01L 29/06; H01L 23/48; H01L 23/02; H01L 39/02
[52] U.S. Cl. ......................................... 357/55; 357/68; 357/71; 357/72; 357/74; 357/80
[58] Field of Search ...................... 357/55, 67, 68, 71, 357/72, 74, 80

[56] References Cited

U.S. PATENT DOCUMENTS

| | | | |
|---|---|---|---|
| 4,056,726 | 11/1977 | Harchol .............................. | 357/55 |
| 4,396,936 | 8/1983 | McIver et al. ........................ | 357/72 |
| 4,484,215 | 11/1984 | Pappos ................................ | 357/80 |
| 4,697,203 | 9/1987 | Sakai et al. ......................... | 357/72 |
| 4,715,115 | 12/1987 | King et al. ......................... | 357/74 |
| 4,736,012 | 4/1988 | Shoji et al. ........................ | 357/72 |
| 4,745,455 | 5/1988 | Glascock, II et al. ............... | 357/72 |

Primary Examiner—J. Carroll
Attorney, Agent, or Firm—Antonelli, Terry, Stout & Kraus

[57] ABSTRACT

The present invention discloses a suitable mounting of a wafer scale LSI (wafer scale integration) (WSI) in which a slit formed in a wafer is fit to a connector, a U-shaped reinforcing rubber member is disposed at the circumferential edge of the wafer, or a flexible adhesive is used for bonding a substrate formed with through-holes and a wafer, to provide a WSI mounting structure of high integration degree and high reliability. Furthermore, a method of efficient mounting by conducting the wiring of the wafer and the connection with the external terminal of the chip in one identical production step is disclosed.

21 Claims, 9 Drawing Sheets

FIG. 1
FIG. 2
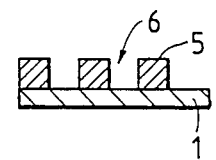
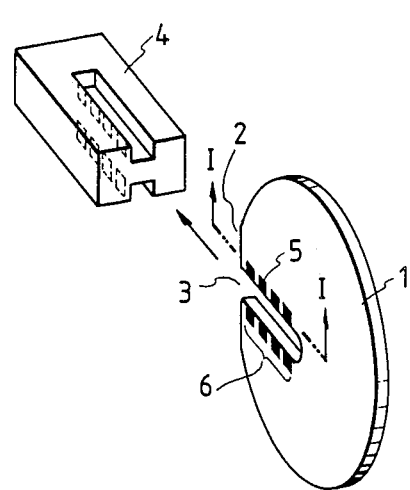
FIG. 3
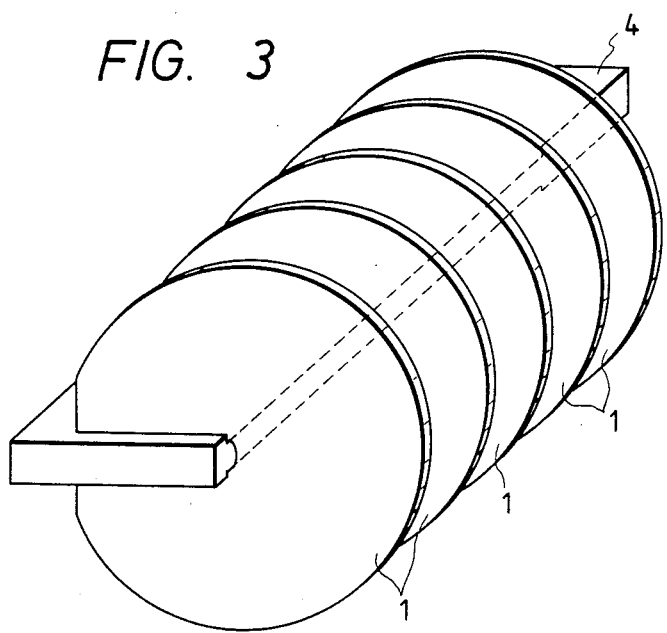

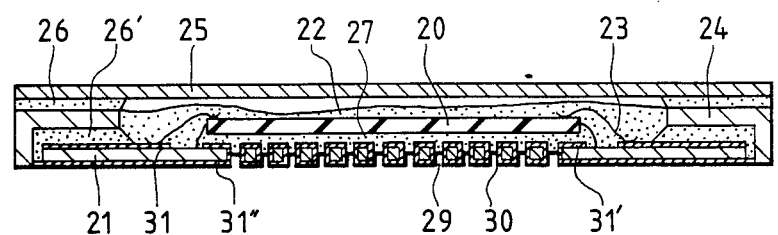
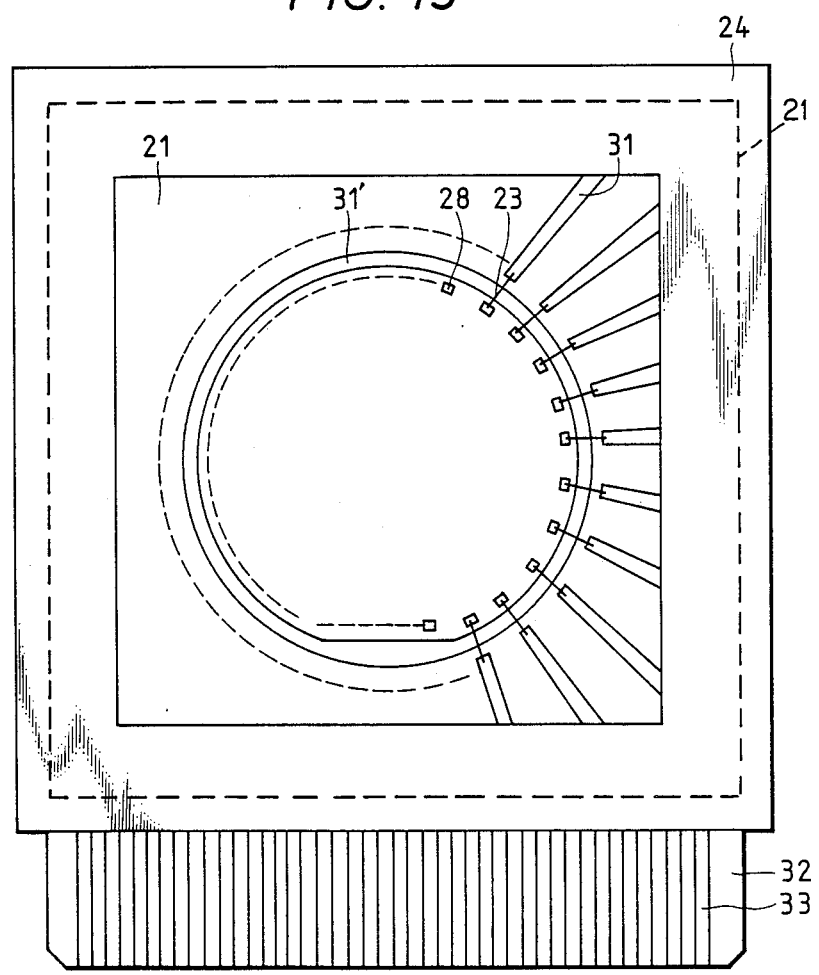

SEMICONDUCTOR DEVICE AND METHOD OF MOUNTING THE SEMICONDUCTOR DEVICE

This application is a continuation of application Ser. No. 210,913, filed on Jun. 24, 1988, now abandoned.

BACKGROUND OF THE INVENTION

The present invention concerns a technique capable of suitable mounting of a large-sized chip or semiconductor wafer of a so-called wafer scale integration having a diameter as large as several inches (hereinafter simply referred to as WSI).

The integration degree in large scale integrated circuits (LSI) has been increased year by year, while the chip size has also been enlarged such as from several millimeter square to 1 centimeter square. Beyond this, a large wafer-scale LSI (WSI) having a 3-inch diameter has come to the stage, and has become a topic in recent years.

"Nikkei Micro Device" issued from Nikkei Macgraw Hill Co., Apr. 1986, pp45-46 describes the following techniques. A semiconductor wafer is formed by a single crystal silicon substrate and used as a wiring substrate capable of constituting semiconductor devices. A semiconductor chip is embedded to the inner side of a square hole formed at the central area of the semiconductor wafer. An epoxy type resin is disposed as a filler and adhesive to the gap between the semiconductor chip and the semiconductor wafer.

Wirings (aluminum wirings) of a predetermined shape are previously formed on the surface of the semiconductor wafer. The wirings of the semiconductor wafer and external terminals of the semiconductor chip (bonding pad) are connected by using connection wirings (aluminum wirings). The connection wirings are formed by a so-called photolithographic technique using a photomask. Several tens types of different patterns are prepared for the photomask, so that the wirings and the external terminals can reliably be connected even if any misalignment occurs between the semiconductor wafer and the semiconductor chip.

As the example of literatures describing WSI, "Nikkei Electronics", 1984, Sept. 24, pp 265-294, issued from Nikkei Macgraw Hill Co. can be mentioned.

SUMMARY OF THE INVENTION

In view of the foregoing technical background, the present inventors have made a study on the mounting of wafer-scale LSI or large-scale chip and found the following problems.

(Problem 1)

As the size of a chip (wafer) to be contained in a package is enlarged there arises a problem that the containment of the chip (wafer) into the package per se is difficult in the conventional system of containing the chip in the package and then mounting the package to a printed wiring substrate, since the stresses resulted to the rear face of the chip is increased as the chip size is enlarged.

(Problem 2)

Since a semiconductor wafer comprises single crystal silicon and the thickness thereof is extremely thin, it is weak to mechanical shocks. Particularly, the strength at the peripheral edge portion of the semiconductor wafer is weak. Accordingly, there is a problem that an integrated circuit device (WSI) is damaged upon mounting or loading to the system.

(Problem 3)

Accompanying with the increase in the chip size, the amount of heat generated upon operation of a semiconductor integrated circuit is also increased correspondingly. In the case of the wafer-scale LSI (WSI), it is estimated to amount as high as 1 KW. Thus, it just brings about a situation as if a large capacity electrical heater were incorporated.

If cooling is insufficient, not only the device is deteriorated but also it may run uncontrollably due to heating or suffers for burning damage.

There is a further significant problem of stresses caused by the difference of the heat expansion between the semiconductor material, for example, Si constituting a semiconductor device such as a wafer-scale LSI (WSI) and the material of a substrate for bonding to fix the former. If the stresses are large, various disadvantages are resulted such as destruction of the bonded portion upon heating/cooling cycle. Furthermore, there is a problem that external forces such as bending stresses exerted on the substrate is liable to propagate to the semiconductor device along with the increase in the bonding face between the semiconductor device and the insulation substrate.

(Problem 4)

Connection wirings in the technique of embedding a semiconductor chip into a semiconductor wafer as described in "Nikkei Micro Device", 1986, Apr. pp 45-46, issued from Nikkei Macgraw Hill Co. described above are formed by selecting one of several tens types of photomasks considering the deviation for the alignment between the semiconductor wafer and wirings and also the deviation of the alignment between the external terminal of the semiconductor chip, as well as the deviation of the alignment between the semiconductor wafer and the semiconductor chip. The number of photomasks is further increased in proportion with the number of semiconductor chips embedded into the semiconductor wafer. In view of above, there is a problem that a semiconductor device in which a semiconductor chip is embedded into a semiconductor wafer is not suitable to the mass production since it takes a long time for the design of the photomask.

Furthermore, since the connection wirings are formed in the production step independent of each of the production steps for the wirings of the semiconductor wafer and the external terminals of the semiconductor chip, the number of production steps for the semiconductor device is increased.

The present invention has been achieved in order to overcome the foregoing problems, and an object of the present invention is to provide a technique enabling suitable mounting of a wafer-scale LSI (WSI), to which a great importance is expected to be attached and for which the demand will be increased more and more in near feature.

Another object of the present invention is to provide a technique for improving the strength of an integrated circuit device composed of semiconductor wafer against mechanical shocks.

A further object of the present invention is to provide a technique capable of reducing the stresses exerted to a semiconductor substrate upon mounting WSI.

A further object of the present invention is to provide a technique capable of mass production of the semiconductor device.

A still further object of the present invention is to provide a technique capable of improving the integration degree of the semiconductor device.

A yet further object of the present invention is to provide a technique capable of reducing the number of production steps for the semiconductor device.

Outlines for typical examples of the invention disclosed in the present application are to be described below.

In the first invention, a slit is formed radially to a wafer and electrodes for use in external connection are disposed along the slit. Then, the wafer is mounted to a connector by fitting the slit portion.

As has been described above, since the wafer has a slit in the radial direction, a plurality of wafers can be mounted while being arranged side by side like that of floppy discs. Further, since the electrode portion for use in external connection is disposed to the slit, electroconduction is established between the connector capable of electrical connection with the electrode portion and connection is enabled even between printed wiring substrates by mounting to the printed wiring substrate by way of the connector.

In the second invention, a reinforcing rubber having elasticity in a U-shaped configuration is disposed while putting the edge of a semiconductor wafer between the edges thereof.

By the means described above, since the edge portion of poor mechanical strength of a semiconductor wafer is protected by the reinforcing rubber, strength of the integrated circuit comprising the semiconductor wafer against mechanical shocks can be improved.

In the third invention, soft and flexible adhesives such as made of silicon rubber or gel type adhesives are used for bonding the semiconductor device to an insulation substrate and the semiconductor device is bonded by means of the adhesives to a through-hole region of the insulation substrate having a plurality of through-holes punctuated at an appropriate interval at a portion to be bonded with the device.

The adhesives are filled to the inside of the through hole in the substrate up to an appropriate depth.

Further, metal film is formed to the inner side of the through holes or the rear face of the insulation substrate.

As has been described above, since the semiconductor device is attached by means of soft and flexible adhesives to the insulation substrate. The difference of the heat expansion coefficient between the insulation substrate and the semiconductor device can be absorbed by the adhesives thereby eliminate the deviation for the alignment. Furthermore, since through-holes are formed at a portion of the insulation substrate to which the semiconductor device is attached and the adhesives have free surface in the through-holes, the free surface can move vertically upon deformation of the substrate thereby serving not to transmit the substrate deformation to the side of the semiconductor device. If there is no such function at the center of the large-sized semiconductor device, the adhesives can no more have free space for deformation but act as a rigid body which can, however, be prevented by the foregoing technique.

Furthermore, by forming the metal film on the inner surface of the through holes or the like heat from the semiconductor device can be escaped transmitting the metal film thereby reducing the thermal resistance, which is effective when a substrate such as of resin substrate with poor heat conductivity is used as the insulation substrate.

In the fourth invention, wirings for a wiring substrate and connection wirings for connecting the wirings for the wiring substrate with external terminals of a semiconductor chip are formed in one identical production step in a semiconductor device in which a semiconductor chip is embedded into a wiring substrate.

According to the means as described above, since the deviation of alignment between the wirings for the wiring substrate and connection wirings is eliminated, and the wirings for the wiring substrate and the connection wirings can be formed with reference to the external terminals of the semiconductor chip, only one photomask is required for forming the connection wirings, thereby enabling mass production.

Furthermore, since wirings for the wiring substrate can be formed in the step of forming the connection wirings, the number of production steps for the semiconductor device can be reduced.

BRIEF DESCRIPTION OF THE DRAWINGS

FIG. 1 is an explanatory view illustrating a first embodiment of the first invention;

FIG. 2 is a cross sectional view for a portion of the first embodiment according to the first invention;

FIG. 3 is a perspective view illustrating the state of mounting the first embodiment of the first invention;

FIG. 12 is a cross sectional view of a semiconductor device illustrating a preferred embodiment of the third invention;

FIG. 13 is a plan view of the semiconductor device shown in FIG. 12 from which a cap is removed;

Figure 4:
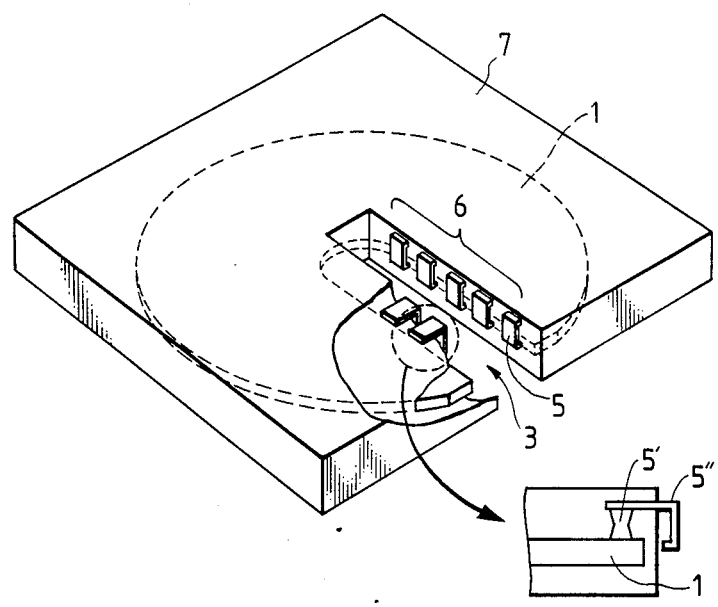
FIG. 4 is a perspective view illustrating the second embodiment of the first invention.

DESCRIPTION OF THE PREFERRED EMBODIMENTS (Example 1)

Description is to be made for the first embodiment of the first invention referring to FIG. 1 through FIG. 3.

As shown in FIG. 1, a wafer 1 is formed with a slit portion 3 of an appropriate width from substantially the central portion of the orientation flat 2 to the center of the wafer. In this case, the end of the slit portion 3 at the wafer center may preferably be in a circular form as shown in FIG. 1. This can prevent the wafer 1 from cracking, upon mounting to a connector 4 as shown in FIG. 1 or FIG. 3.

An electrode portion 6 comprising a plurality of electrodes 5 are arranged side by side along both sides of the slit 3 of the wafer 1. The electrode portion 6 may also be disposed only along one side of the slit portion 3.

FIG. 2 shows a cross sectional view for a portion of the electrode portion 6 taken along line I—I in FIG. 1.

As shown in FIG. 1 and FIG. 3, the wafer 1 is mounted to the connector 4 by inserting the connector 4 into the slit portion 3 of the wafer 1, or vice versa.

Internal wirings in the wafer 1 are led out from the electrode portion 6 and, although not illustrated in FIG. 3, the connector 4 also has electrodes and electrical connection is made between the electrode portion of the wafer 1 and the electrode of the connector 4. As shown in FIG. 3, the wafer 1 can be mounted to the connector 4 while being disposed in plurality like that of floppy discs (five in the illustrated example).

FIG. 4 shows the second embodiment in which the first invention is applied to the mounting of a wafer 1 to a package 7, in which an electrode portion 6 is formed on both sides of a slit portion 3 and an electrode 5 is formed by attaching an electrode lead 5" by means of a soldering bump 5' to the wafer 1.

Figure 5:
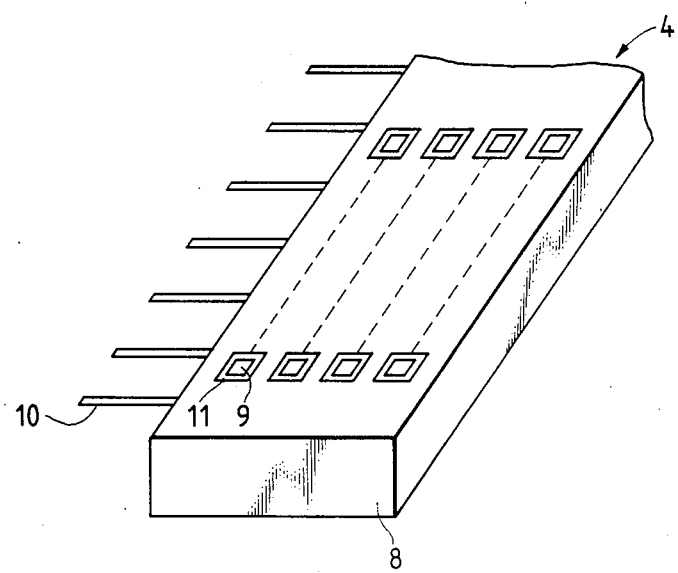
FIG. 5 is a perspective view for a connector illustrating the third embodiment of the first invention.

FIG. 5 shows a connector 4 corresponding to FIG. 4 in which are shown a connector main body 8, connector electrode portions 9 and leads 10 (terminals for use in external connection). Further, the connector electrode portion 9 is formed to the inside of a hole 11 formed to the connector main body 8. Electrical connection is established upon mounting between the electrode portion 6 of the chip 7 and the electrode portion 9 of the connector 4.

The wafer 1 and the package 7 are, for example, made of silicon single crystal substrate and a plurality of circuit elements are formed in the wafer or the chip by well-known techniques to provide a circuit function. A specific example of the circuit device is, for example, a MOS transistor and the circuit function such as of logic circuit and memory is formed by these circuit elements.

According to the first invention, the slit portion 3 is formed to the wafer 1 or the wafer scale package 7 mounting the wafer and the electrode portion 6 is disposed to the slit portion 3, while the electrode portion 9 is disposed along the connector 4, by which mounting of the wafers to the connector 4 while being arranged side by side like that of floppy discs is enabled by utilizing the slit portion. In the case of mounting the wafer, it may be considered to vertically mount the wafer formed with an electrode portion to the orientation flat thereof to the surface of a printed wiring substrate. However, since the wafer is mounted in a not stable state on the printed wiring substrate in this case, the wafer is liable to be damaged. Although, it may also be considered to form a circular hole at the center of the wafer, through which a connector is inserted and mounted, the wafer is liable to be damaged in this case. On the contrary, according to the first invention, a wafer or wafer scale chip can be mounted detachably to a connector by utilizing the slit portion, by which the mechanical strength can be improved.

(Example 2)

Figure 6:
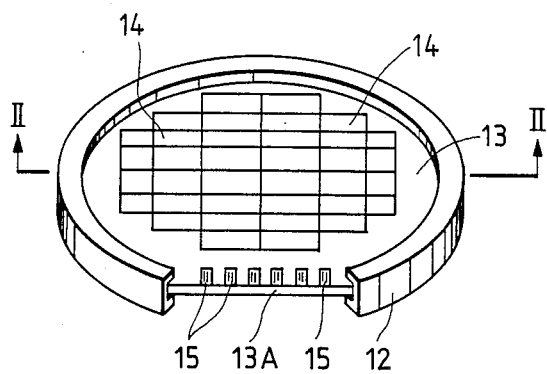
FIG. 6 is a perspective view of a semiconductor integrated circuit device for the first embodiment of the second invention.
Figure 7:
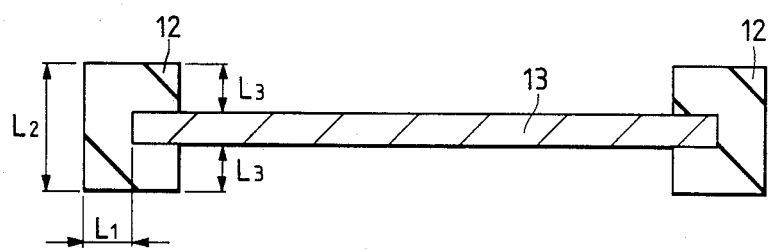
FIG. 7 is a cross sectional view taken along line II—II in FIG. 6.
Figure 8:
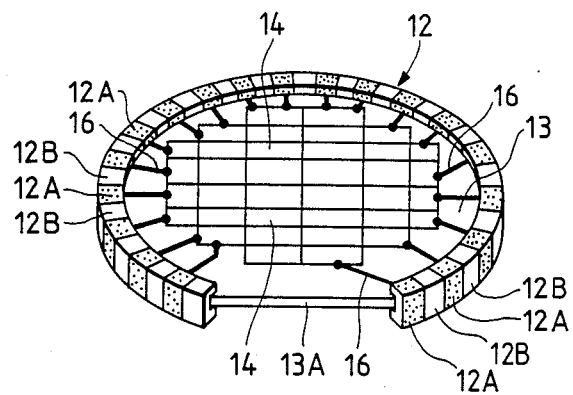
FIG. 8 is a perspective view of a semiconductor integrated circuit device for the second embodiment of the second invention.

The first embodiment of the second invention is to be explained referring to FIG. 6 and FIG. 7.

As shown in FIG. 6 and FIG. 7 in an integrated circuit device of the first embodiment, various integrated circuits 14 such as memories or peripheral circuits therefor, logics, etc. are formed, for example, on one main surface of a semiconductor wafer 13 made of single crystal silicon, while electrodes 15 of the integrated circuit device are formed to an orientation flat 13A. Then, a resilient reinforcing rubber member 12 of a U-shaped cross section is disposed so as to put the edge portion of the semiconductor wafer 13 therebetween except for the orientation flat 13A so as to improve the mechanical shocks resistance. The reinforcing rubber member 12 is made, for example, of a silicon resin represented by the following chemical

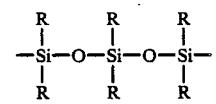

The reinforcing rubber member 12 is not in a complete ring shape but it is not disposed at the portion of the orientation flat 13A, because the reinforcing rubber member 12 can be attached to and detached from the semiconductor wafer 13 easily and the stresses applied to the reinforcing rubber member 12 can be released. The thickness $L_1$ of the reinforcing rubber member 12 along the plane of the semiconductor wafer 13 is about 2-3 mm, the thickness $L_2$ for the entire reinforcing rubber member 12 in the direction vertical to the main surface of the semiconductor wafer 13 is about 5 mm and the length $L_3$ from the main surface or rear face of the semiconductor wafer 13 to the upper surface or the lower surface of the reinforcing member 12 is about 2 mm. The reinforcing rubber member 12 can be formed integrally by casting a silicone resin into a mold.

Then, the second embodiment of the second invention is to be explained referring to FIG. 8 through FIG. 11.

A reinforcing rubber member 12 comprises an electroconductive reinforcing rubber member 12A serving both as the electrode of an integrated circuit 14 and an insulating reinforcing rubber member 12B, which are alternately disposed with each other. Electrodes of other systems are connected with the electroconductive reinforcing rubber members 12A. Both of the electroconductive reinforcing rubber member 12A and the insulating rubber member 12B have resiliency and their cross sections are formed into a U-shape so as to put the edge of the semiconductor wafer 13 therebetween. The electroconductive reinforcing rubber member 12A is made, for example, of a butadiene - acrylonitrile copolymer rubber (electroconductive filler blended) and the resistance value thereof is less than 10 Ω cm. The insulating rubber member 12B is made of the same silicone resin as that for the reinforcing rubber member 12 in the first embodiment. The electroconductive reinforcing rubber members 12A and the integrated circuits 14 are connected, for example, by way of aluminum wirings 16.

Figure 9:
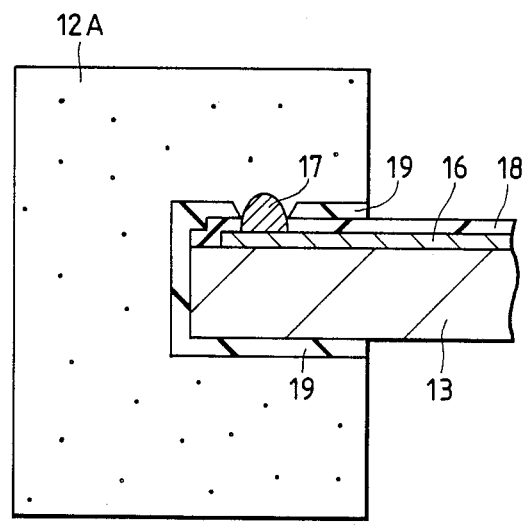
FIG. 9 is a cross sectional view illustrating the connection portion between the electroconductive reinforcing rubber and wirings for the second embodiment of the second invention.
Figure 10:
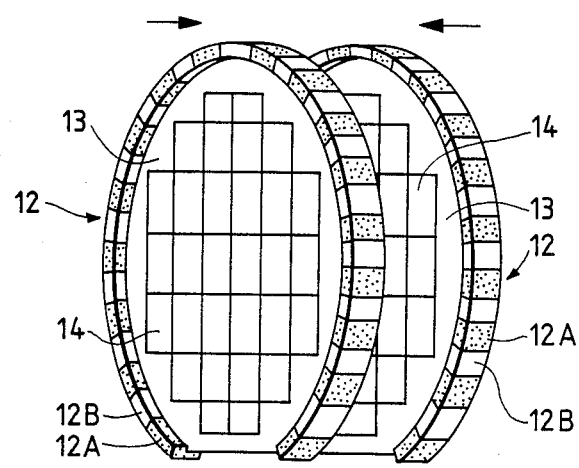
FIG. 10 is a view illustrating a state in which two semiconductor integrated devices are stacked to constitute a system for the second embodiment of the second invention.

FIG. 9 shows the outline for the cross section of the connection portion between the electroconductive reinforcing rubber member 12A and the wiring 16.

As shown in FIG. 9, the wiring 16 and the electroconductive reinforcing rubber member 12A are connected by a bump electrode 17, for example, made of Au. While on the other hand, the electroconductive reinforcing rubber member 12A is insulated from the edge and the lower surface of a semiconductor wafer 13 by means of an insulation layer 19, for example, made of polyimide type organic material. In this way, since the external electrode of the integrated circuit device comprises the resilient electroconductive reinforcing rubber member 12A, it is possible to moderate the impact shocks upon connecting the electrodes of other systems not illustrated. A final protection layer 18 for the integrated circuit device is made, for example, of silicon oxide layer formed by plasma CVD, etc.

The integrated circuit device in the second embodiment can constitute, as shown in FIG. 9, a large system by connecting a plurality of integrated circuit devices by means of electroconductive reinforcing rubber members 12A with each other. The electroconductive reinforcing rubber members 12A are connected with each other by press-bonding, etc.

Figure 11:
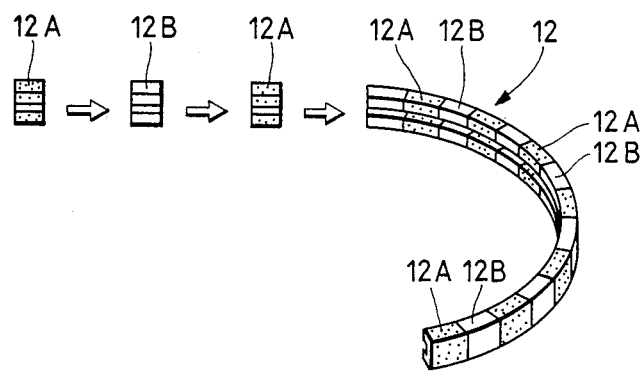
FIG. 11 is a view for explanating the method of forming reinforcing rubber made of electroconductive reinforcing rubber and insulating reinforcing rubber for the second embodiment of the second invention.

The electroconductive reinforcing rubber members 12A and the insulation reinforcing rubber members 12B constitute the reinforcing rubber member 12 by alternately bonding them with adhesives as shown in FIG. 11.

As has been described above according to the second invention, since a resilient reinforcing rubber member of a U-shaped cross section is disposed along the edge of a semiconductor wafer so as to put the edge therebetween, the edge portion of the semiconductor wafer which has weak mechanical strength can be protected by the reinforcing rubber and the mechanical strength of the semiconductor integrated circuit device comprising the semiconductor can be improved.

In addition, since a portion of the reinforcing rubber member is made of electroconductive reinforcing rubber members used as the electrode for the integrated circuit device, the shocks upon connection with the electrodes of other systems can be moderated and, accordingly, the mechanical strength of the semiconductor integrated circuit device can be increased.

(Example 3)

The third invention is to be explained referring to FIG. 12 through FIG. 15.

FIG. 12 is a cross sectional view for one embodiment of the semiconductor device according to the third invention.

In FIG. 12, are shown semiconductor element 20, insulation substrate 21, sealing material 22, connector wire 23, frame 24, cap 25, bonding materials 26, 26', soft and flexible adhesive 27, through holes 29 perforated in the insulation substrate 21, metal film 30 formed on the inner surface of the through hole 29, wiring pattern 31 disposed on the surface of the insulation substrate 21 and metal layers 31', 31" respectively.

FIG. 13 shows a plan view for FIG. 12 from which the cap 25 is removed.

As shown in FIG. 12, a plurality of through holes 29 are perforated each at an appropriate interval to an insulation substrate 21. The through holes 29 are disposed within an area to which the semiconductor element 20 is to be attached.

The semiconductor element 20 is bonded and secured by way of the adhesive 27 to the attaching surface of the insulation substrate 21 having the through holes 29 formed therein.

As shown in FIG. 12, since the through holes 29 are formed in the insulation substrate 21, the adhesive 27 flows from the surface of the insulation substrate to the inside of the through holes 29, filling to an appropriate position of the through holes 29.

The metal layer 31' formed at the periphery for each of the through holes 29 and the wiring pattern 31 are provided to the surface of the insulation substrate 21.

Further, the metal layer 30 is formed on the inner surface of the through hole 29.

Furthermore, the metal layer 31" is formed on the entire rear face of the insulation substrate 21.

The metal layer 31' formed at the periphery for each of the through holes and the metal layer 31" formed at the rear face of the insulation substrate are connected by means of the metal layer 30 formed to the inner surface of the through hole 29.

Surface treatment for the wire bonding with the connector wire 23 can be applied to the inner end of the wiring pattern 31.

The electrode pad 28 disposed at the periphery of the semiconductor device 20 and the inner end of the wiring pattern 31 at the surface of the insulation substrate 21 are wire-bonded by means of the connector wire 23.

The frame 24 is disposed vertically to the circumferential end of the insulation substrate 21 by using the bonding material 26, and the sealing material 22 is poured to the inside defined by the frame 24 to cover the semiconductor element 20, the connector wire 23, etc.

The cap 25 is bonded over the frame 24 by means of the bonding material 26.

As shown in FIG. 13, the wiring pattern 31 on the surface of the insulation substrate 21 is extended to the edge portion 32 and the extended wiring pattern 31 is used as terminals 33 for connection with the external portion.

The semiconductor element 20 used in the third invention may be a wafer scale chip, as well as other wafers having a large chip (pellet).

The semiconductor element 20 comprises, for example, a silicon single crystal substrate and a plurality of circuit elements are formed on the inside thereof by well-known technique to provide a circuit function. The specific example of the circuit element is, for example, a MOS transistor and these circuit elements constitute the circuit function, for example, of logic circuit and memory.

The insulation substrate 21 is formed, for example, of a resin substrate and preferred examples thereof can include substrates made of glass, kepler or silica glass fiber reinforced biphenyltriazine, or epoxy substrate or polyimide substrate.

The wiring pattern 31 at the surface of the insulation substrate 21, the metal layer 31', the metal layer 31" at the rear face of the insulation substrate 21 or the metal layer 30 at the inner surface of the through hole 29 are formed, for instance, of Cu or Cu alloy.

As an example of the forming methods, a Cu foil is laminated on each of the surface and the rear face of the insulation substrate 21, and then a wiring pattern 31 is formed by using photoresist technique or etching technique, the through hole 29 is perforated at a predetermined position and the metal layer 30 is formed on the inner surface of the through hole 29 by means of plating technique, etc.

As the sealing material 22, a silicone type gel is preferably used. As the silicone type gel, silicone coating agents commercially available so far for use in electronics or optical fibers can be used. For example, the silicone gel has been used as a counter measure for the soft errors in IC memories.

In the third invention, such a silicone gel is used as the sealing material.

The gel is in a liquid state before heat curing and classified into a one component type or a two component type. For instance, in the case of a two component type comprising a main agent and a curing agent, they react with each other to cure upon mixing (crosslinking reaction), to obtain a curing product.

The curing systems include condensation type, addition type and UV-ray curing type as shown by the following reaction schemes:

Condensation type:

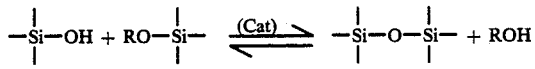

Cat: Sn—Ti type catalyst
R: alkyl group, etc. (herein and hereinafter)

Addition type:

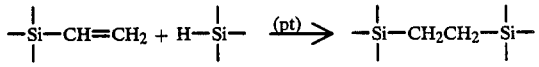

UV-ray curing type:

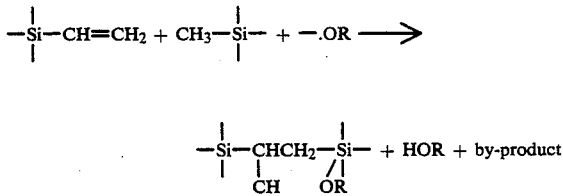

When baking for obtaining a curing product, rubber-formation is proceeded.

The silicone type gel 22 used in the third invention has low crosslinking density different from silicone rubber or silicone oil.

For instance, in view of the extent of the cross-liking density, rubber has the highest crosslinking density, gel has the density next to the rubber and oil has further lower density.

The crosslinking density is measured generally by using a penetrometer, which is defined in JIS K 2808 and the needle used therefor is defined in ASTM D 1321.

In view of the penetration, it is generally in the range from 40 to 200 mm for gel, 40 mm or less for oil. The rubber formation occurs by the promotion of the gel curing reaction and those referred to as rubber generally have penetration of 200 mm or greater.

As the silicone type gel used in the third invention, those commercially available are used as described above and, for example, KJR9010, X-35-100, manufactured by Shinetsu Chemical Industry Co., JCR 6110 manufactured by Toray Silicone Co., etc. can be used.

The curing reaction mechanism of the X-35-100 described above (two component type of A (main agent) and B (curing agent), penetration 100) is that of the platinum addition type and the two component low temperature and high temperature gel can be used within a temperature range from −75° to 250° C.

The silicone type gel is excellent in the moisture resistance. It is preferable to dispose a space between the surface of the silicone type gel 22 and the cap 25 as shown in FIG. 1.

The connector wire 23 is constituted, for example, with an Au wire or Al wire.

The frame 24 and the cap 25 serve to prevent the deformation of the insulation substrate 21 by the external force. It is desirable that the misalignment in view of the heat expansion between the frame 24 and the insulation substrate 21 is reduced as much as possible. From this viewpoint, it is preferred that the frame 24 and the cap 25 are constituted, for example, with triazine or Al.

As the bonding material 26 for bonding the frame 24 to the insulation substrate 21 or as the bonding material 26' for bonding the cap 25 to the frame 24, a silicone rubber type adhesive is used for instance.

As the adhesive 27 used upon mounting the semiconductor element 20 on the insulation substrate 21 in the third invention, a soft and flexible adhesive is used. Examples of such adhesive 27 can include the silicone type gel as described above or silicone type rubber adhesive.

Powdery filler having high heat conductivity and/or low heat expansion coefficient is preferably mixed in the adhesive 27.

According to the third invention, since such a soft and flexible adhesive 27 made of silicone type gel or rubber is used for the bonding between the insulation substrate 21 and the semiconductor element 20 and the through holes 29 are perforated at the mounting portion of the element 20 in the substrate 21, misalignment due to the difference in the heat expansion coefficient between the substrate 21 and the element 20 can be eliminated even when a large wafer scale LSI, etc. is mounted and, further, misalignment caused by the difference of the heat expansion coefficient between the substrate 21 and the element 20 can be overcome and the deformation of the substrate 21, if should occur, can be prevented from transmitting to the element 20, by which useful technique can be obtained in the case of mounting the large element 21.

Figure 14:
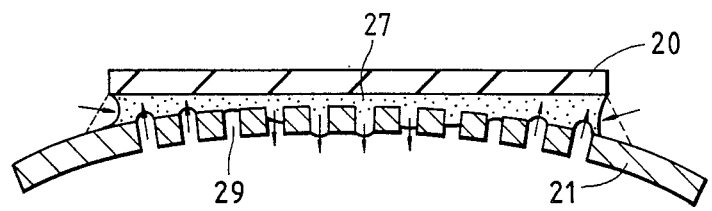
FIG. 14 and FIG. 15 are, respectively, cross sectional views of portions for illustrating the function and the effect of a preferred embodiment of the third invention.
Figure 15:
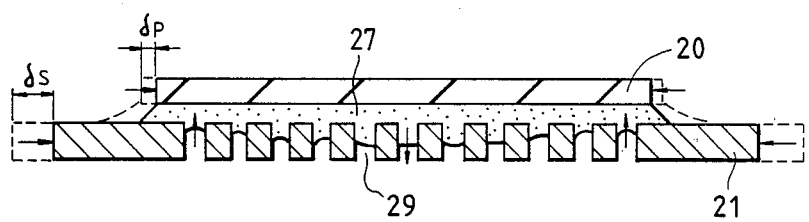

The function and the effect of the third invention are to be explained referred to FIG. 14 and FIG. 15. Since the through holes 29 are perforated to the insulation substrate 21, the adhesive 27 is not in contact with the surface of the insulation substrate 21 in the through holes 29 but it has a free surface.

Then, the adhesive 27 is soft and flexible as described above.

As a result, as shown in FIG. 14, when the insulation substrate 21 is warped upwardly, the free surface of the adhesive 27 in the through hole 29 can be moved upwardly or downwardly as shown by the arrows in the figure. By such displacement of the free surface of the adhesive 27, it is possible to prevent the external force such as bending stress exerted to the insulation substrate 21 from being transmitted to the semiconductor element 20.

FIG. 15 shows a state where the misalignment of the heat expansion and contraction upon heating/cooling is absorbed by the adhesive 27, in which an example of change upon cooling is shown here.

The insulation substrate 21 deforms (δs) at the outer periphery thereof upon cooling. The displacement δs is, for example, about five times as large as the displacement (δp) at the outer periphery of the semiconductor element 20 and destruction of the semiconductor 20, etc. will be caused unless the difference δs−δp at the circumference is absorbed in a certain place. Accordingly, movement of the free surface of the adhesive 27 is conducted in the through hole 29 and, by the movement of the free surface, the displacement δs−δp at the outer periphery can be taken into the semiconductor device mounting portion having the through holes 29 and large distortion, if exerted, can be withstood satisfactorily.

Furthermore, the metal layer 30 is formed on the inner surface of the through hole 29, the metal layer 31' is also formed at the surface of the insulation substrate 21 and, further, the metal layer 31" is also formed at the rear face of the insulation substrate 21. Accordingly, the heat generated from the semiconductor element 20 can preferably be escaped by way of the metal layers 31', 30, 31" from the rear face of the insulation substrate 21.

Particularly, if the metal layer 31" at the rear face of the insulation substrate 21 is formed over the entire surface, the heat dissipation area is enlarged and effective heat dissipation is enabled by applying a slight blow.

The formation of such metal layer 30, etc. is advantageous in the case of using the resin substrate 21 of low heat conductivity and a semiconductor device of a structure with a small heat resistance can be obtained while using such a resin substrate 21.

Furthermore, it is also effective in the case of sealing the semiconductor element 20, etc. with the silicone gel sealing material 22 although having excellent moisture proofness but somewhat poor in the heat conductivity.

According to the third invention, it is possible to provide a semiconductor device of a structure capable of dissolving the misalignment for the heat expansion coefficient upon bonding a wafer scale semiconductor element to a substrate and less transmitting the external force such as bending stresses exerted on the substrate to the wafer scale semiconductor element. Further, the problem of heat generation accompanying increased integration degree of the semiconductor elements can also be overcome.

(EXAMPLE 4)

Figure 16:
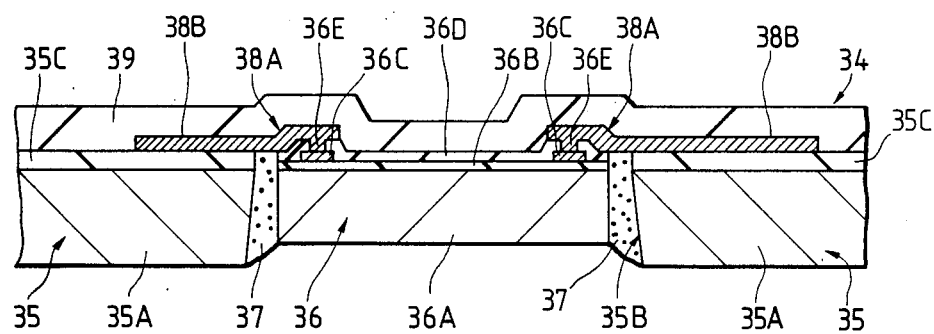
FIG. 16 is a cross sectional view illustrating a portion of a semiconductor device showing a preferred embodiment of the fourth invention.

FIG. 16 shows a principal portion of a semiconductor device as the fourth invention (in cross sectional view).

As shown in FIG. 16, a semiconductor chip 36 is embedded to a hole 35B of a wiring substrate 35 in a semiconductor device 34.

The wiring substrate 35 comprises a single crystal silicon substrate 35A (semiconductor wafer) substantially of a circular shape. Further, the wiring substrate 35 may also be constituted with a square single crystal silicon substrate. Further, the wiring substrate 35 may also be constituted with a compound semiconductor substrate such as made of GaAs, InP, ceramic substrate, or resin substrate such as made of epoxy type resin or polyimide type resin.

The hole 35B is formed at the central area of the single crystal silicon substrate 35A for the wiring substrate 35 (not defined only to that region) with a size somewhat greater than that for the semiconductor chip.

The hole 35B is formed, for example, by etching the (100) face of the single crystal silicon substrate 35A by means of anisotropic wet etching till the substrate is perforated. In this case, since the inner diameter situates at the (111) face, the cross sectional shape of the hole 35B is trapezoidal.

The semiconductor chip 36 is embedded within the hole 35B of the wiring substrate 35 by way of the filler (or adhesive) 37. The filler 37 is so constituted as to fill the gap between the semiconductor chip 36 and the wiring substrate 35, as well as bond both of them with each other. An epoxy type resin, for example, is used for the filler 37.

The semiconductor chip 36 is constituted with a single crystal silicon substrate 36A in the same manner as the wiring substrate 35. Alternatively, the semiconductor chip 36 may be constituted with a compound semiconductor such as made of GaAs or InP, which may be identical with or different from that for the wiring substrate 35.

Although not illustrated for the sake of simplification, in the semiconductor chip 36, a semiconductor element is formed on the main surface of the single crystal silicon substrate 36A and a plurality of insulation layers and wiring layers are formed to the upper layer of the semiconductor element. The wiring layer is constituted, for example, with a single layer of polycrystalline silicon wirings (gate wiring) and two layers of aluminum wiring. The aluminum wiring at the upper layer of the two layers is formed on the inter layer insulation layer 36B. An external terminal 36C of the semiconductor chip 36 (bonding pad) is constituted by one and identical production step (identical wiring layer) with the aluminum wiring in the upper layer. The surface of the external terminal 36C is constituted so as to be exposed through the opening 36E formed on the passivation layer 36D at the upper layer thereof.

One end of a connection wiring 38A is connected through the opening 36E to the external terminal 36C of the semiconductor chip 36. The other end of the connection wiring 38A is connected with a wiring 38B extended on the single crystal silicon substrate 35A of the wiring substrate 35 by way of the inter layer insulation layer 35C. The wiring 38B is used as the wiring for the wiring substrate 35. The connection wiring 38A and the wiring 38B are constituted integrally (in one identical production step). Each of the connection wiring 38A and the wiring 38B is constituted, for example, with an aluminum layer or an aluminum layer containing predetermined additive (Cu, Si). One end of the connection wire 38A is constituted with a large size (with allowable dimension) by so much as corresponding to the deviation upon alignment in connection with the external terminal 36C of the semiconductor chip 36. In this embodiment, the wiring substrate 35 is constituted with the one layer wiring structure of the wiring 38B.

A protection layer 39 is disposed over the entire surface including the semiconductor chip 36 and the wiring substrate 35 (or on the connection wiring 38A and the wiring 38B). A polyimide resin layer is used, for example, for the protection layer 39. Alternatively, a silicon oxide film or silicon nitride film may be used as the protection layer 39.

Then, a specific production process for the semiconductor device 34 of the embodiment according to the fourth invention will be explained simply referring to FIG. 17 through FIG. 20 (cross sectional views for the semiconductor device shown on every production step).

Figure 17:
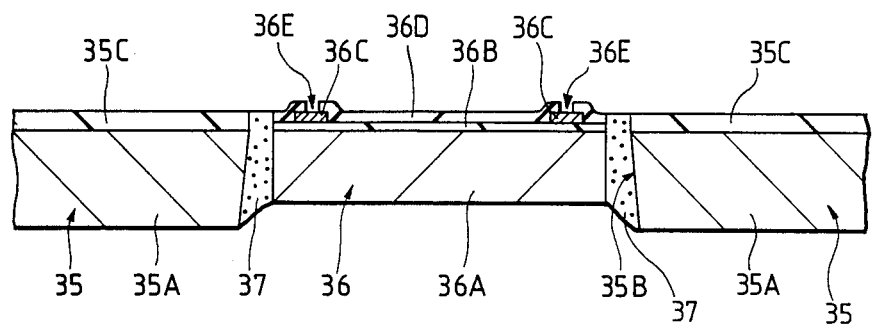
FIG. 17 through FIG. 20 are cross sectional views illustrating the portions of the semiconductor device shown in FIG. 16 on every production step.

At first, as shown in FIG. 17, the semiconductor chip 36 is embedded to the hole 35B in the wiring substrate 35 by way of the filler 37. The semiconductor chip 36 is inserted from the rear side of the wiring substrate 35 (on the side applied with etching), to improve the flatness between the surface of the semiconductor chip 36 and the surface of the wiring substrate 35.

Figure 18:
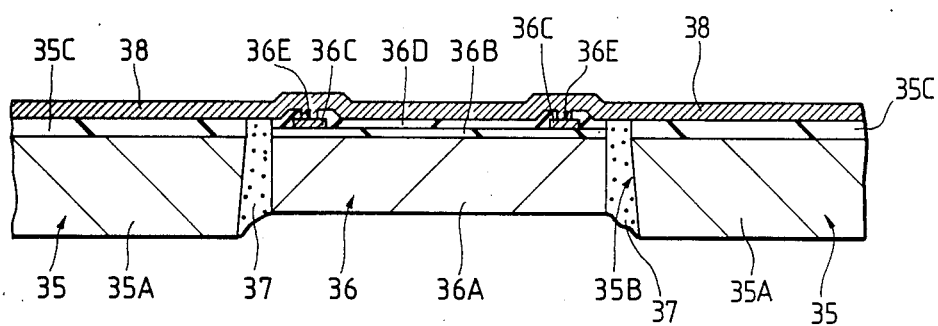

Then, as shown in FIG. 18, a wiring forming layer 38 is formed over the entire surface including on the surface of the passivation layer 36D of the semiconductor chip 36 and on the interlayer insulation layer 35C of the wiring substrate 35 respectively. The wiring forming layer 38 is formed so as to be in connection with the external terminal 36C through the opening 36E of the semiconductor chip 36. For the wiring forming layer 38, an aluminum layer deposited by sputtering is used for instance.

Figure 19:
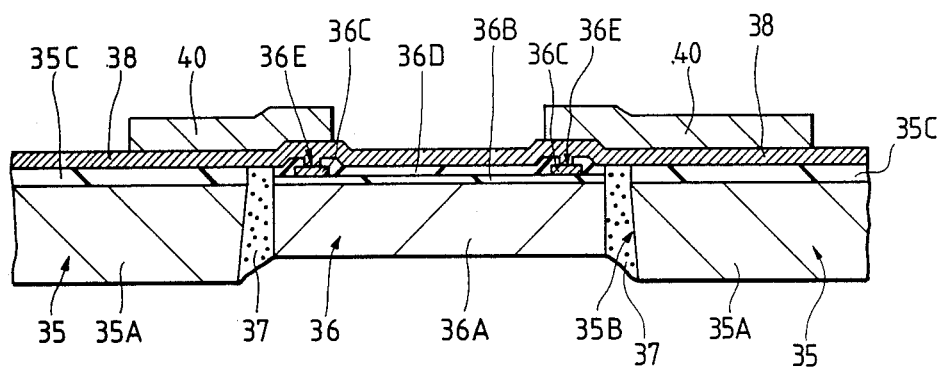

Then, a photoresist layer is coated on the wiring forming layer 38. Then, the photoresist layer is patterned into a predetermined shape by using photolithography technique to form a mask 40 for etching as shown in FIG. 19.

The photolithography means such a technique of forming latent images on the photoresist film by using a not-illustrated photomask (or reticle) and then applying development to the photoresist film.

Figure 20:
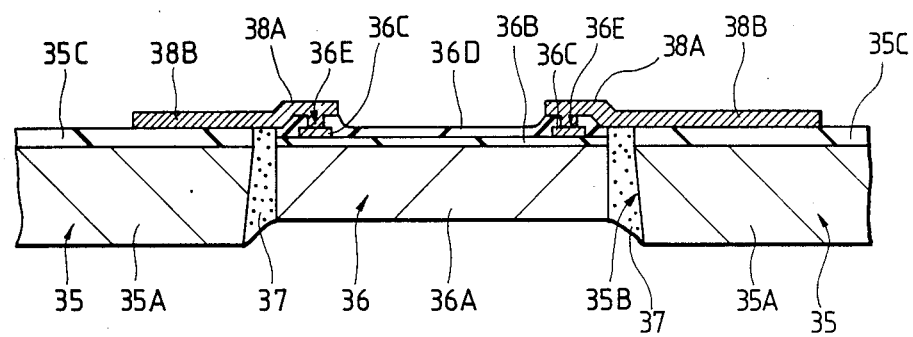

Then, the wiring forming layer 38 is etched by using the mask 40 to form the connection wiring 38A and the wiring 38B in one identical production step. The wiring forming layer 38 is etched, for example, by anisotropic dry etching. Thereafter, as shown in FIG. 20, the mask 40 is removed.

In this way, in the semiconductor device 34 in which the semiconductor chip 36 is embedded in the wiring substrate 35, since the wiring 38 for the wiring substrate 35 and the connection wiring 38A for connecting the wiring 38B for the wiring substrate 35 and the external terminal 36C of the semiconductor chip 36 are formed in one identical production step, misalignment between the wiring 38B for the wiring substrate 35 and the connection wiring 38 is eliminated and the wiring 38B for the wiring substrate 35 and the connection wiring 38A can be formed with reference to the external terminal 36C of the semiconductor chip 36 and, accordingly, it is necessary to use only one photomask (one type) for forming the connection wiring 38A. That is, although the misalignment between the external terminal 36C and one end of the connection wiring 38A is present, the misalignment between the other end of the connection wiring 38A and the wiring 38B for the wiring substrate 35 and the misalignment between the semiconductor chip 36 and the wiring substrate 35 are substantially eliminated. As a result, since the designing time for the photomask can be shortened, mass production of the semiconductor device 34 is possible.

In addition, since the extent of misalignment can be decreased as described above, integration degree of the semiconductor device 34 can be improved.

Furthermore, since the wiring 38B for the wiring substrate 35 can be formed in the step for forming the connection wiring 38A, the number of production steps for the semiconductor device 34 can be decreased.

After the step of forming the connection wiring 38A and the wiring 38B shown in FIG. 40, the protection layer 39 is formed as shown in FIG. 16. By applying a series of such production steps, the semiconductor device 34 as the embodiment of the fourth invention is completed.

In the foregoing embodiments, although the wiring substrate 35 is constituted with a single layer wiring structure, the present invention can be constituted with two or more of plurality wiring layer structure for the wiring substrate 35. In the case of constituting the wiring substrate with the two layer wiring structure, the lower layer wiring out of the two layers is constituted integrally with the connection wiring for connection with the external terminal of the semiconductor chip. The upper layer wiring of the two layer wiring structure is formed as the wiring for connection between the lower layer wirings described above. The lower layer wiring and the upper layer wiring are separated by way of the interlayer insulation film and connection between them is carried out through the connection holes formed on the insulation film between the layers.

Further, although only one semiconductor chip 36 is embedded to the wiring substrate 35 in the foregoing embodiment, a plurality of semiconductor chips 36 may be embedded to the wiring substrate 35 in the present invention.

According to the fourth invention, since one photomask is enough to form the connection wiring in a semiconductor device in which a semiconductor chip is embedded to a wiring substrate, mass production is possible. In addition, the number of production steps for the semiconductor device can be decreased.

What is claimed is:

1. A wafer scale semiconductor device comprising:
   (a) a wafer scale substrate having a main surface constituted with circuits, a rear surface and a substantially circular peripheral surface;
   (b) a slit formed from a part of said peripheral surface to a center of said substrate in a direction of a radius, wherein said slit passes through the main surface to the rear surface; and
   (c) a plurality of electrodes disposed along said slit and on said main surface.

2. A wafer scale semiconductor device according to claim 1, wherein an end of said slit at the center of said substrate is made circular.

3. A wafer scale semiconductor device according to claim 1, further comprising:
   (d) a connector having concave portions, and connector electrode portions formed along said concave portions,
   wherein said plurality of electrodes on the main surface are electrically connected with said connector electrode portions.

4. A wafer scale semiconductor device according to claim 1, further comprising:
   (e) a plurality of bump electrodes on which said electrodes are formed; and
   (f) a package having a front surface, a back surface and a side surface, said slit is formed from a part of said side surface to a center of the package, and a plurality of electrode leads connected to said bump electrodes,
   wherein said package includes said wafer scale substrate therein as to correspond to each slit formed within said substrate and said package.

5. A wafer scale semiconductor device according to claim 4, further comprising:
   (g) a connector having a first surface and a second surface and a side surface, a plurality of external leads and a plurality of connector electrode portions formed on said first surface and said second surface,
   wherein said plurality of electrode leads are electrically connected with said plurality of connected electrode portions.

6. A wafer scale semiconductor device comprising:
   (a) a wafer scale semiconductor device having a main surface constituted with integrated circuits, a rear surface and a peripheral surface, wherein said peripheral surface is comprised of two surfaces, one of which is a substantially circular portion and another of which is a substantially flat portion;
   (b) a plurality of electrodes disposed to said flat portion of the peripheral surface; and
   (c) a reinforcing rubber member having a U-shaped cross-section formed so as to cover a part of said main and rear surfaces, and said circular portion of the peripheral surface therebetween.

7. A wafer scale semiconductor device according to claim 6, wherein the reinforcing rubber member is made of a silicone resin.

8. A wafer scale semiconductor device comprising:
   (a) a wafer scale semiconductor device having a main surface constituted with integrated circuits and including a plurality of input/output terminals, a rear surface and a peripheral surface, wherein said peripheral surface is comprised of two surfaces, one of which is a substantially circular portion and another of which is a substantially flat portion; and
   (b) a reinforcing rubber member having a U-shaped cross-section formed so as to cover a part of said main and rear surface, and said circular portion of the peripheral surface therebetween,
   wherein said reinforcing rubber member comprises electroconductive rubber and insulation rubber members, wherein said electroconductive rubber and insulation rubber members are disposed alternately with each other and said electroconductive rubber members are connected so as to correspond with said input/output terminals.

9. A wafer scale semiconductor device according to claim 8, wherein the electroconductive rubber member is made of a butadiene-acrylonitrile copolymer rubber.

10. A wafer scale semiconductor device according to claim 8, wherein the insulation rubber member is made of a silicone rubber.

11. A wafer scale semiconductor device according to claim 8, wherein the connection between the electroconductive rubber member and the input/output terminals is made by way of aluminum wirings.

12. A wafer scale semiconductor device comprising:
   (a) a wafer scale substrate having a main surface constituted with circuits, a rear surface and a substantially circular peripheral surface;
   (b) a plurality of electrodes disposed on said main surface;
   (c) an insulation substrate having a first surface and a second surface, said first surface being arranged for bonding to secure said wafer scale substrate and metal layers, wherein a plurality of through-holes are formed from said first surface to said second surface under an area of said wafer scale substrate;
   (d) an adhesive for bonding said wafer scale substrate onto said insulation substrate; and
   (e) a plurality of wires electrically connecting said electrodes and said metal layers formed on said first surface of the insulation substrate,
   wherein said adhesive is formed between said wafer scale substrate and at least said first surface of the insulation substrate.

13. A wafer scale semiconductor device according to claim 12, further comprising:
   (g) a frame member disposed at a position surrounding said wafer scale substrate.

14. A wafer scale semiconductor device according to claim 12, wherein the insulation substrate is made of glass, kepler or silica glass fiber-reinforced biphenyltriazine substrate, epoxy substrate or polyimide substrate.

15. A wafer scale semiconductor device according to claim 12, wherein the adhesive is soft and flexible material.

16. A wafer scale semiconductor device according to claim 12, wherein the soft and flexible material is a silicone type gel a silicone type rubber.

17. A wafer scale semiconductor device according to claim 12, further comprising:
   (f) sealing material for sealing said main surface of said wafer scale substrate, said electrodes and said wires.

18. A wafer scale semiconductor device according to claim 12, wherein the sealing material is a silicon type gel.

19. A wafer scale semiconductor device according to claim 12, further comprising:
   (h) a cap bonded to said frame member for sealing said wafer scale substrate.

20. A wafer scale semiconductor device according to claim 12, wherein said plurality of electrodes are arranged along said peripheral surface of said wafer scale substrate.

21. A wafer scale semiconductor device comprising:
   (a) a wafer scale substrate having a main surface constituted with circuits, a rear surface and a substantially circular peripheral surface;
   (b) a plurality of electrodes disposed on said main surface;
   (c) an insulation substrate having a first surface and a second surface, said first surface being arranged for bonding to secure said wafer scale substrate and metal layers, wherein a plurality of through-holes are formed from said first surface to said second surface under an area of said wafer scale substrate; and
   (d) an adhesive for bonding said wafer scale substrate onto said insulation substrate,
   wherein said plurality of electrodes are electrically connected with said metal layers arranged on said first surface.

* * * * *